(12) United States Patent
Matsuyama et al.

(10) Patent No.: US 11,378,621 B2
(45) Date of Patent: Jul. 5, 2022

(54) DIGITAL OUTPUT MONITOR CIRCUIT AND HIGH FREQUENCY FRONT-END CIRCUIT

(71) Applicant: Murata Manufacturing Co., Ltd., Kyoto (JP)

(72) Inventors: Satoru Matsuyama, Kyoto (JP); Satoshi Matsumura, Kyoto (JP); Kazuhiro Nakamuta, Kyoto (JP); Toshiki Matsumura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 348 days.

(21) Appl. No.: 16/751,771

(22) Filed: Jan. 24, 2020

(65) Prior Publication Data

US 2020/0249274 A1    Aug. 6, 2020

(30) Foreign Application Priority Data

Jan. 31, 2019  (JP) .............................. JP2019-016126
Oct. 28, 2019  (JP) .............................. JP2019-195539

(51) Int. Cl.
*H03F 3/20*   (2006.01)
*G01R 31/3163*  (2006.01)
*H03M 9/00*   (2006.01)
*H04B 17/16*  (2015.01)
*H03F 3/189*  (2006.01)

(52) U.S. Cl.
CPC ........... *G01R 31/3163* (2013.01); *H03F 3/20* (2013.01); *H03M 9/00* (2013.01); *H04B 17/16* (2015.01); *H03F 2200/451* (2013.01)

(58) Field of Classification Search
CPC . G01R 31/3163; H03F 3/20; H03F 2200/451; H03F 1/0266; H03F 2200/411; H03F 3/195; H03M 9/00; H04B 17/16
USPC .................................................. 330/250, 285
See application file for complete search history.

(56) References Cited

U.S. PATENT DOCUMENTS

| 6,559,788 | B1 | 5/2003 | Murphy |
| 7,583,087 | B2* | 9/2009 | Pilling ............... G11C 29/1201 |
| | | | 324/522 |
| 2002/0026553 | A1 | 2/2002 | Saito |
| 2017/0154002 | A1 | 6/2017 | Hu et al. |

FOREIGN PATENT DOCUMENTS

| JP | 2002-24201 A | 1/2002 |
| JP | 2016-45123 A | 4/2016 |

* cited by examiner

*Primary Examiner* — Hieu P Nguyen
(74) *Attorney, Agent, or Firm* — Pearne & Gordon LLP

(57) ABSTRACT

A digital output monitor circuit includes a first digital circuit that performs mutual conversion between serial data and parallel data, a second digital circuit that decodes data output from the first digital circuit and generates a control signal for an analog circuit, and a third digital circuit that converts at least the control signal for an analog circuit into digital data. The first digital circuit converts the data output from the third digital circuit into serial data and outputs as an output data signal.

20 Claims, 17 Drawing Sheets

DIGITAL OUTPUT MONITOR CIRCUIT AND HIGH FREQUENCY FRONT-END CIRCUIT

This application claims priority from Japanese Patent Application No. 2019-016126 filed on Jan. 31, 2019, and claims priority from Japanese Patent Application No. 2019-195539 filed on Oct. 28, 2019. The content of these applications are incorporated herein by reference in their entireties.

BACKGROUND

The present disclosure relates to digital output monitor circuits and high frequency front-end circuits.

Japanese Unexamined Patent Application Publication No. 2002-24201 describes a semiconductor integrated circuit that enables to perform debugging efficiently by converting an internal signal inside a system LSI before output.

BRIEF SUMMARY

For example, a high frequency front-end circuit for amplifying a high frequency signal of radio frequency is generally configured in such a way that a digital circuit including a processor and the like and an analog circuit including an amplifier circuit and the like are mounted together in the same module. When a control signal for an analog circuit is tested in a module such as the above in which a digital circuit and the analog circuit are mounted together, there is a need to provide a terminal for testing in the processor or the module or perform a test indirectly through the operation of the analog circuit in the case where the terminal for testing cannot be provided because of limitation in mounting area of an IC chip of the processor, the circuit area, or the like. An operation test of an analog circuit is performed in all of the operational conditions of the analog circuit. Thus, the duration of testing becomes very long, and it is difficult to perform the test to a sufficient degree in light of quality assurance.

The present disclosure realizes a high frequency front-end circuit and a digital output monitor circuit that enables to facilitate testing of an analog circuit in a configuration where a digital circuit and the analog circuit are mounted together.

A digital output monitor circuit according to one aspect of the present disclosure includes a first digital circuit that performs mutual conversion between serial data and parallel data, a second digital circuit that decodes data output from the first digital circuit and generates a control signal for an analog circuit, and a third digital circuit that converts at least the control signal for an analog circuit into digital data, wherein the first digital circuit converts data output from the third digital circuit into serial data and outputs as a output data signal.

A high frequency front-end circuit according to one aspect of the present disclosure includes the foregoing digital output monitor circuit, and an amplifier circuit that amplifies a high frequency signal, the amplifier circuit serving as the analog circuit.

Other features, elements, characteristics and advantages of the present disclosure will become more apparent from the following detailed description of embodiments of the present disclosure with reference to the attached drawings.

DETAILED DESCRIPTION

Hereinafter, digital output monitor circuits and high frequency front-end circuits according to embodiments are described in detail based on the drawings. Note that the present disclosure is not limited by these embodiments. Needless to say, each embodiment is for illustrative purposes only, and configuration elements of different embodiments may be combined or partially exchanged. In the description of the embodiment 2 and subsequent embodiments, the description regarding a matter common to the embodiment 1 will be omitted, and only points different from the embodiment 1 will be described. In particular, similar functions and effects produced by similar configuration elements will not be repeated in every embodiment.

EMBODIMENTS

Embodiments will be described below. However, to facilitate understanding of the embodiments, a comparison example is described first.

Comparison Example

Figure 1:
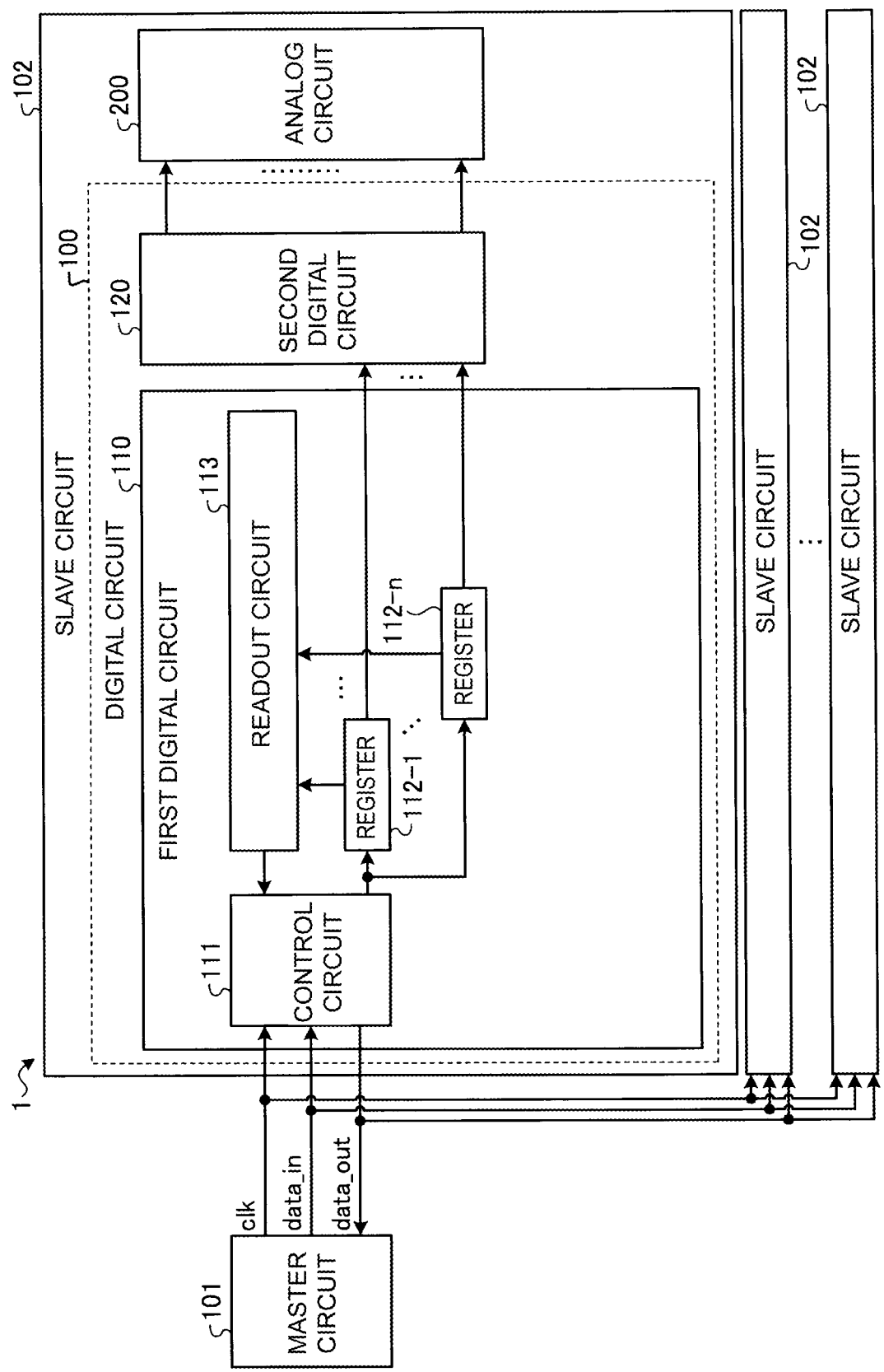
FIG. 1 is a diagram illustrating a system configuration of a comparison example.

FIG. 1 is a diagram illustrating a system configuration of a comparison example. A system 1 includes a master circuit 101 and a plurality of slave circuits 102. In the present disclosure, the plurality of slave circuits 102 have similar configurations, but the configuration of the slave circuit 102 is not limited thereto. Hereinafter, the configuration of one of the plurality of slave circuits 102 is described, and the description regarding the configurations of the remaining slave circuits 102 is omitted.

The slave circuit 102 includes a digital circuit 100 and an analog circuit 200. The digital circuit 100 includes a first digital circuit 110 and a second digital circuit 120.

The first digital circuit 110 includes a control circuit 111, a plurality (in the present disclosure, it is assumed to be n (n is a natural number)) of registers 112-1, . . . , 112-n, and a readout circuit 113.

In the present disclosure, it is assumed that the registers 112-1, . . . , 112-n are 8-bit registers, but are not limited thereto. Hereinafter, the description is provided assuming that each piece of digital data in the present disclosure is 8-bit data.

The master circuit 101 outputs a clock signal clk and an input data signal data_in to the slave circuit 102. Here, the input data signal data_in is serial data. The input data signal data_in includes various commands for the slave circuit 102 and control information and the like for the first digital circuit 110, the second digital circuit 120, and the analog circuit 200.

The slave circuit 102 outputs an output data signal data_out, which is serial data, to the master circuit 101. The output data signal data_out includes readout data read out from the registers 112-1, . . . , 112-n by the readout circuit 113.

The first digital circuit 110 performs mutual conversion between serial data and parallel data. Specifically, the first digital circuit 110 outputs control data for the analog circuit 200 included in the input data signal data_in to the second digital circuit 120 in the subsequent stage. Further, the first digital circuit 110 converts data read out from the registers 112-1, . . . , 112-n by the readout circuit 113 into the output data signal data_out and outputs to the master circuit 101. Hereinafter, the operation of each configuration element of the first digital circuit 110 will be described with reference to FIG. 2.

Figure 2:
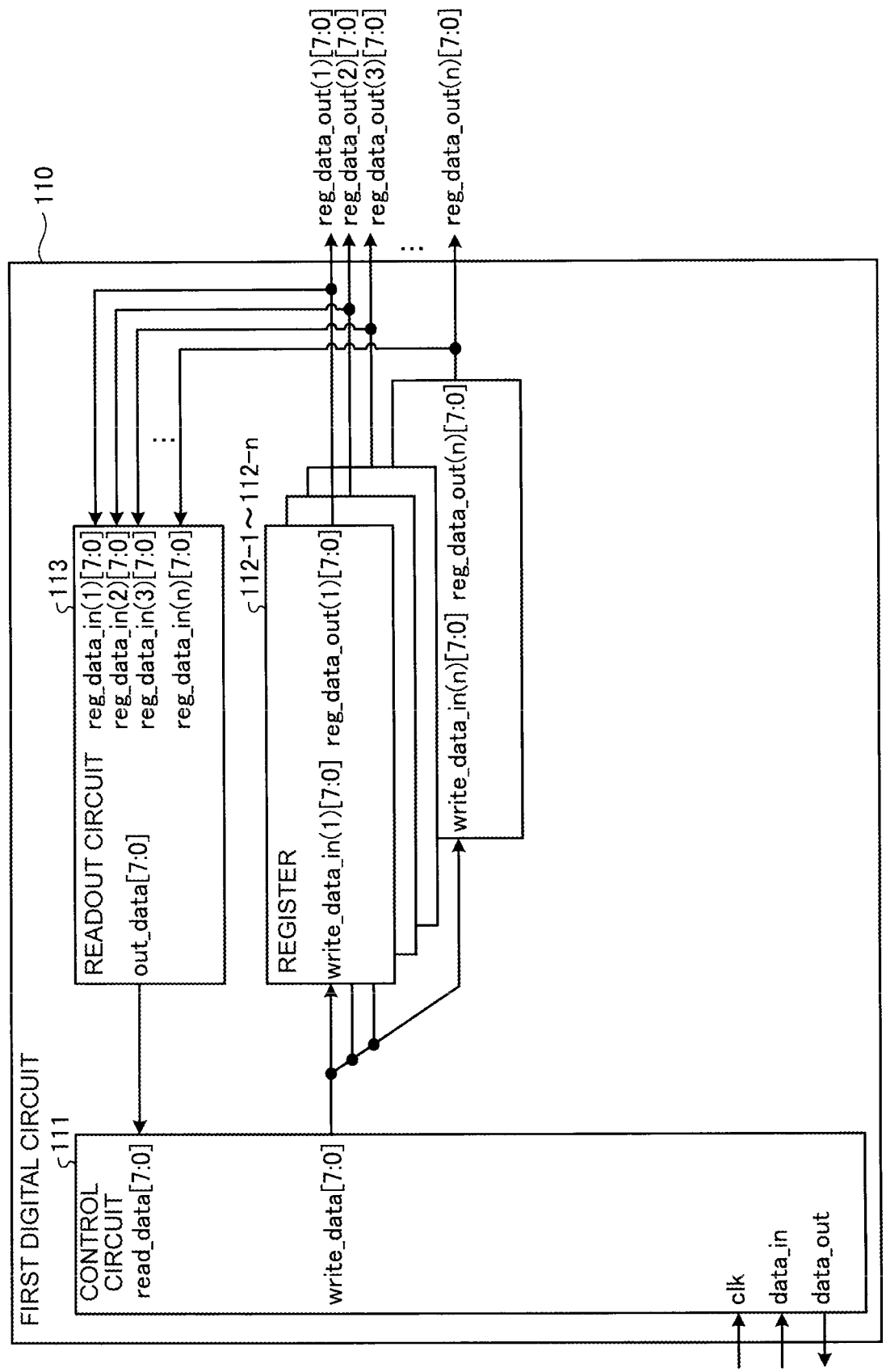
FIG. 2 is a diagram illustrating one example of an internal configuration of a first digital circuit of the comparison example.

FIG. 2 is a diagram illustrating one example of an internal configuration of a first digital circuit of the comparison example. In FIG. 2, "[7:0]" attached to each piece of data indicates that each piece of data is 8-bit data in which the least significant bit is zeroth bit and the most significant bit is 7th bit.

The control circuit 111 outputs the control data for the analog circuit 200 as write data write_data_in(1) [7:0], . . . , write_data_in(n) [7:0] to the registers 112-1, . . . , 112-n based on a control command included in the input data signal data_in, respectively. The write data write_data_in(1) [7:0], . . . , write_data_in(n) [7:0] are respectively written in the registers 112-1, . . . , 112-n and output to the second digital circuit 120 in the subsequent stage as register data reg_data_out(1) [7:0], . . . , reg_data_out(n) [7:0].

Further, the register data reg_data_out(1) [7:0], . . . , reg_data_out(n)[7:0] are read out by the readout circuit 113 as readout data reg_data_in(1) [7:0], . . . , reg_data_in(n) [7:0], respectively.

The readout circuit 113 outputs the readout data reg_data_in(1) [7:0], . . . , reg_data_in(n) [7:0], which are read out from the registers 112-1, . . . , 112-n, to the control circuit 111 as output data out_data[7:0].

The control circuit 111 receives the output data out_data [7:0] output from the readout circuit 113 as readout data read_data[7:0]. The control circuit 111 converts the readout data read_data[7:0] into the output data signal data_out and outputs to the master circuit 101.

As describe above, the first digital circuit 110 converts the data written in the registers 112-1, . . . , 112-n into the output data signal data_out and outputs to the master circuit 101. This enables the system 1 to perform a correctness determination on the data written in the registers 112-1, . . . , 112-n using the master circuit 101 in the subsequent stage.

Next, a specific example of the system 1 is described. An exemplification of the system 1 is, for example, a portable cellular terminal such as a smartphone or the like. In the portable cellular terminal, the master circuit 101 corresponds to a baseband circuit. Further, in the portable cellular terminal, the slave circuit 102 corresponds to a high frequency front-end circuit that amplifies a high frequency signal of radio frequency. Further, in the portable cellular terminal, the digital circuit 100 corresponds to a processor of the high frequency front-end circuit. Further, in the portable cellular terminal, the analog circuit 200 includes an amplifier circuit that amplifies a high frequency input signal and outputs a high frequency output signal.

Figure 3:
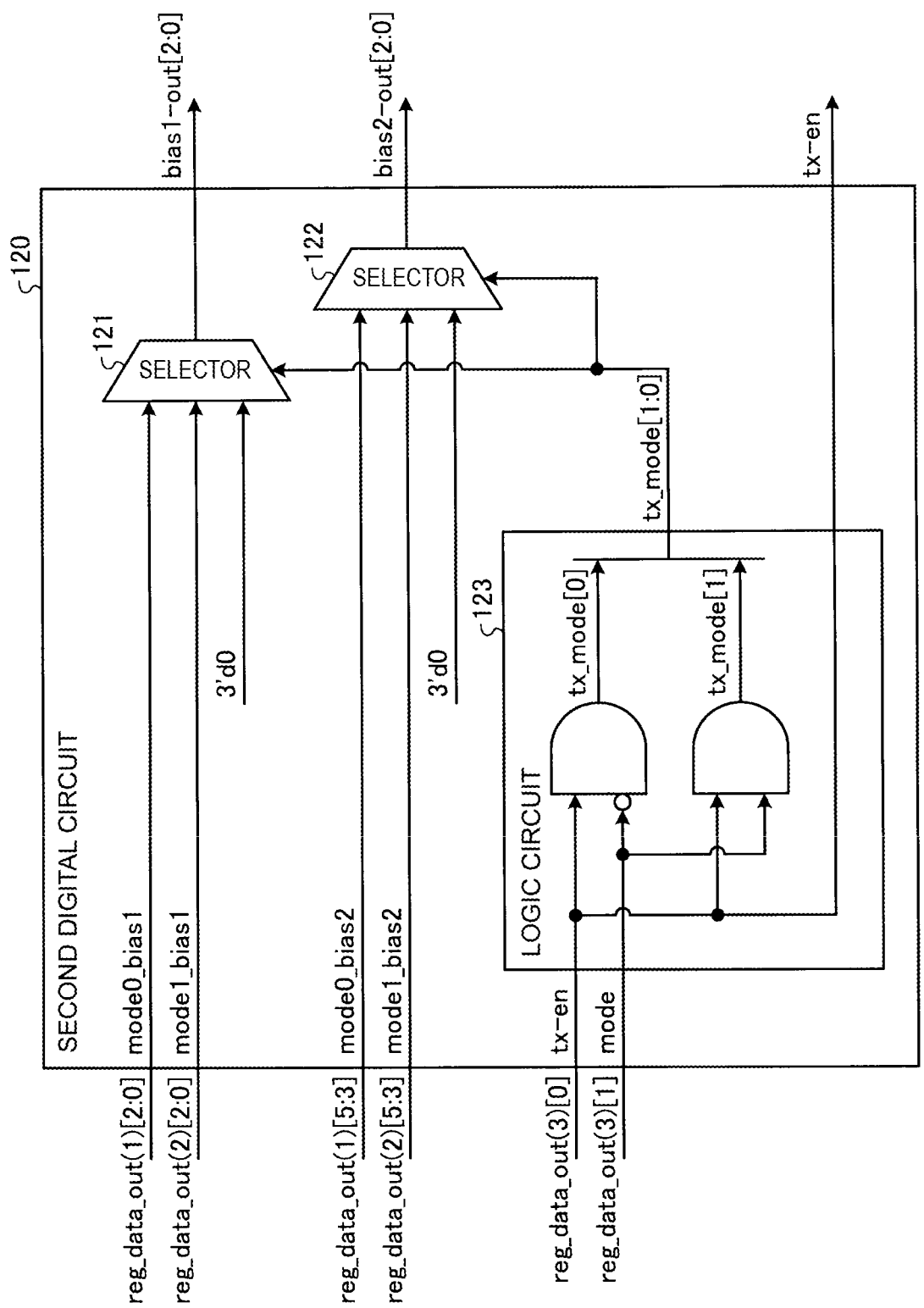
FIG. 3 is a diagram illustrating one example of a specific configuration of a second digital circuit.
Figure 4:
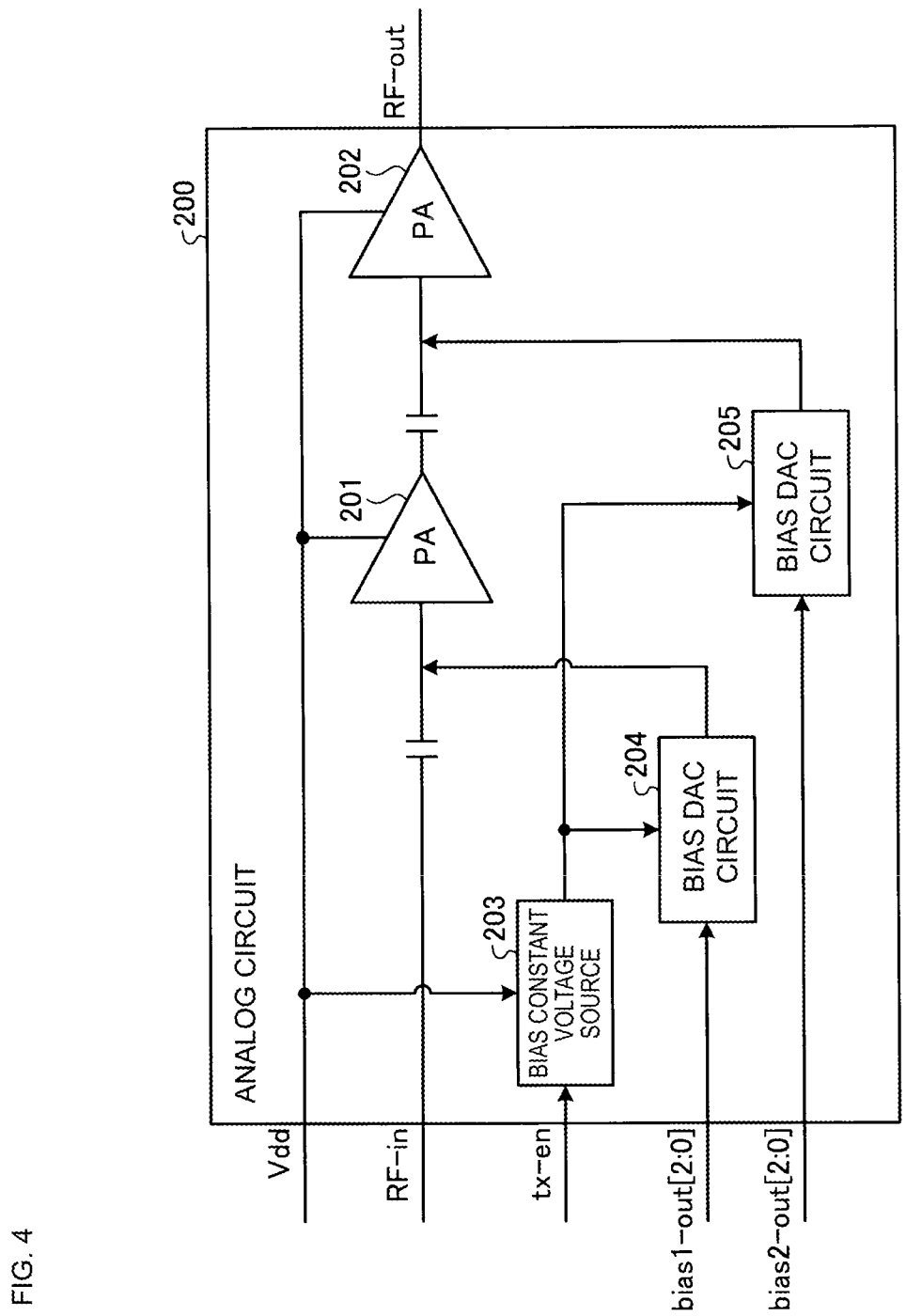
FIG. 4 is a diagram illustrating one example of a specific configuration of an analog circuit.

Here, the configuration including a first operation mode and a second operation mode as the operation mode of the high frequency front-end circuit is described with reference to FIG. 3 and FIG. 4. The first operation mode and the second operation mode are different from each other in bias voltage of the amplifier circuit. FIG. 3 is a diagram illustrating one example of a specific configuration of the second digital circuit. FIG. 4 is a diagram illustrating one example of a specific configuration of the analog circuit.

In the example illustrated in FIG. 3, the second digital circuit 120 includes selectors 121 and 122 and a logic circuit 123. Further, in the example illustrated in FIG. 4, the analog circuit 200 includes a first amplifier circuit 201, a second amplifier circuit 202, a bias constant voltage source 203, and bias DAC circuits 204 and 205.

In the example illustrated in FIG. 4, the analog circuit 200 has the configuration including a two-stage amplifier circuit made up of the first amplifier circuit 201 and the second amplifier circuit 202. Alternatively, the analog circuit 200 may have the configuration including a single stage amplifier circuit or a multi-stage amplifier circuit including three or more amplifying stages.

The bias DAC circuit 204 sets an electric bias state of the first amplifier circuit 201. The bias DAC circuit 205 sets an electric bias state of the second amplifier circuit 202. The bias constant voltage source 203 applies a constant reference voltage to the bias DAC circuits 204 and 205. A power supply voltage Vdd is applied to the first amplifier circuit 201, the second amplifier circuit 202, and the bias constant voltage source 203.

Note that in the examples illustrated in FIG. 3 and FIG. 4, the configurations are illustrated in which the bias state associated with the operation mode (the first operation mode, the second operation mode) is set in the first amplifier circuit 201 and the second amplifier circuit 202. However, the configurations illustrated in FIG. 3 and FIG. 4 are examples thereof and are not limited thereto. For example, the configuration may include a configuration unit that enables band switching of high frequency signal or switching of amplification gain.

First, the operation of the second digital circuit 120 is described.

In the example illustrated in FIG. 3, bias control data mode0_bias1 in the first operation mode of the first amplifier circuit 201 is 3-bit data included in the register data reg_data_out(1) [2:0] of the register 112-1. Further, bias control data mode1_bias1 in the second operation mode of the first amplifier circuit 201 is 3-bit data included in the register data reg_data_out(2) [2:0] of the register 112-2.

Further, in the example illustrated in FIG. 3, bias control data mode0_bias2 in the first operation mode of the second amplifier circuit 202 is 3-bit data included in the register data reg_data_out(1) [5:3] of the register 112-1. Further, bias control data mode1_bias2 in the second operation mode of the second amplifier circuit 202 is 3-bit data included in the register data reg_data_out(2) [5:3] of the register 112-2.

Further, in the example illustrated in FIG. 3, operation control data tx_en that controls the operations of the first amplifier circuit 201 and the second amplifier circuit 202 included in the analog circuit 200 is 1-bit data included in the register data reg_data_out(3) [0] of the register 112-3. Further, mode control data mode that switches between the first operation mode and the second operation mode is 1-bit data included in the register data reg_data_out(3) [1] of the register 112-3.

When the operation control data tx_en is "0", mode switch data tx_mode[1:0] is "00". At this time, the selector 121 outputs data 3'd0"000" as first bias control data bias1_out[2:0]. Further, the selector 122 outputs data 3'd0"000" as second bias control data bias2_out[2:0].

When the operation control data tx_en is "1" and the mode control data mode is "0", the mode switch data tx_mode[1:0] is "01". At this time, the selector 121 outputs the bias control data mode0_bias1 as the first bias control data bias1_out[2:0]. Further, the selector 122 outputs the bias control data mode0_bias2 as the second bias control data bias2_out [2:0].

When the operation control data tx_en is "1" and the mode control data mode is "1", the mode switch data tx_mode[1:0] is "10". At this time, the selector 121 outputs the bias control data mode1_bias1 as the first bias control data bias1_out[2:0]. Further, the selector 122 outputs the bias control data mode1_bias2 as the second bias control data bias2_out [2:0].

The first bias control data bias1_out[2:0], the second bias control data bias2_out[2:0], and the operation control data tx_en are output to the analog circuit 200 in the subsequent stage. Here, the first bias control data bias1_out[2:0], the second bias control data bias2_out[2:0], and the operation control data tx_en are collectively referred to as a "control signal for an analog circuit".

Next, the operation of the analog circuit 200 is described.

When the operation control data tx_en is "0", the bias constant voltage source 203 stops applying of the reference voltage to the bias DAC circuits 204 and 205. This sets the electrical bias states of the first amplifier circuit 201 and the second amplifier circuit 202 to a GND level, thereby stopping the output of a high frequency output signal RF-out.

When the operation control data tx_en is "1", the electric bias state of the first amplifier circuit 201 is controlled based on the first bias control data bias1_out[2:0]. Further, the electric bias state of the second amplifier circuit 202 is controlled based on the second bias control data bias2_out [2:0].

As described above, the second digital circuit 120 has a decoding function that converts the register data reg_data_out(1) [7:0], . . . , reg_data_out(n) [7:0] output from the registers 112-1, . . . , 112-n of the first digital circuit 110 into a control signal for an analog circuit for controlling the analog circuit 200 in the subsequent stage.

Embodiment 1

Figure 5:
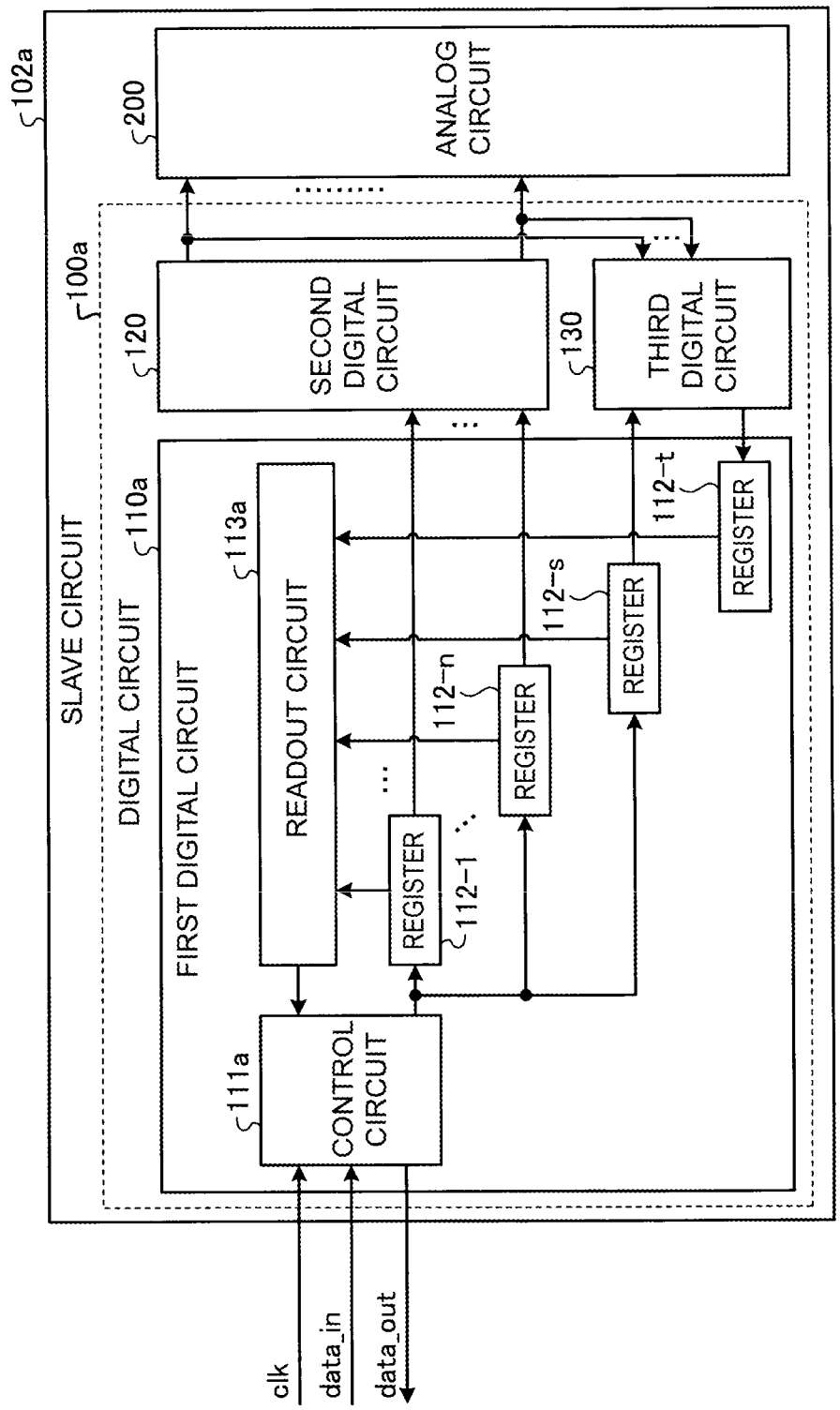
FIG. 5 is a diagram illustrating a configuration of a slave circuit of an embodiment 1.
Figure 6:
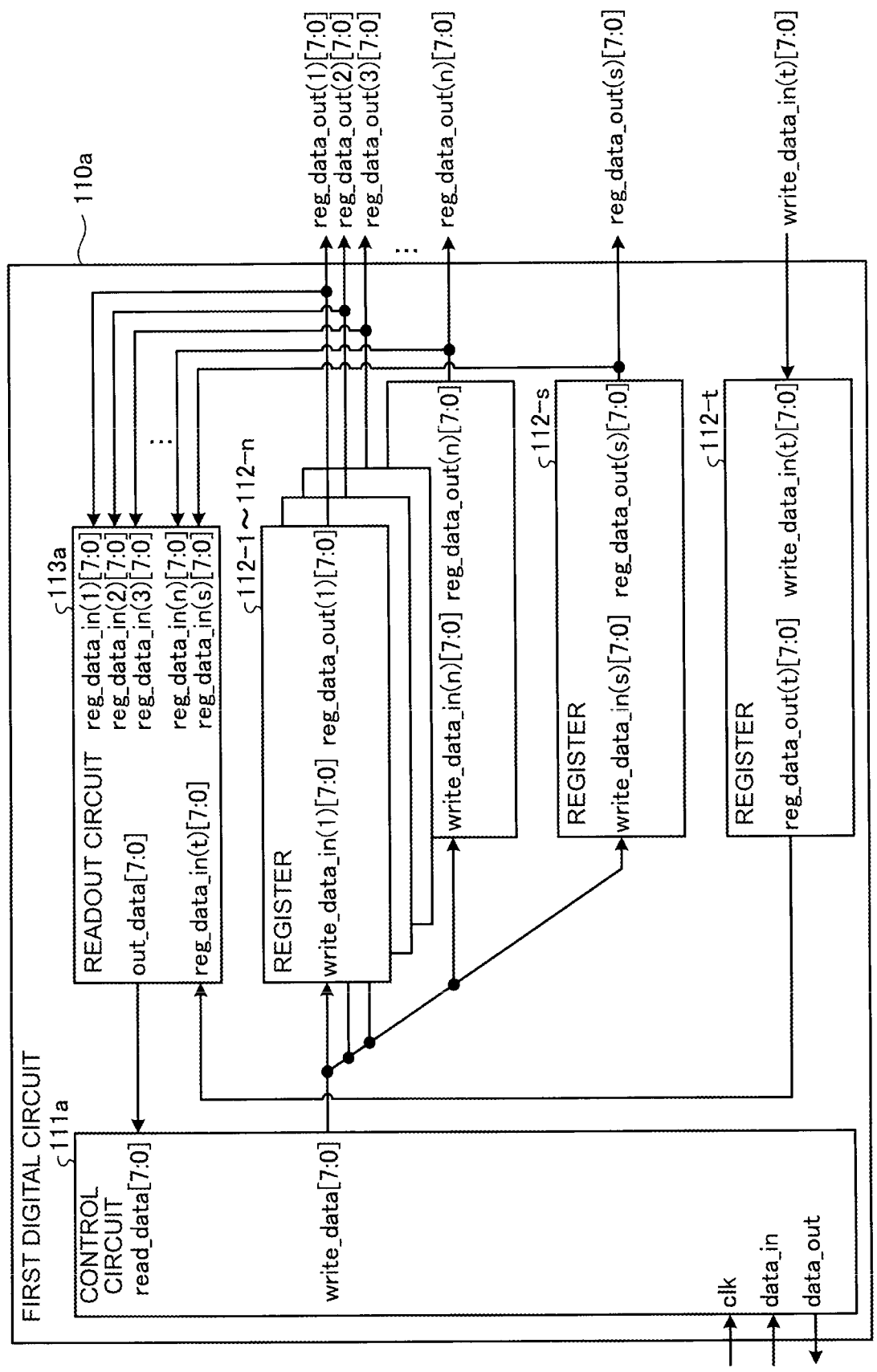
FIG. 6 is a diagram illustrating one example of an internal configuration of a first digital circuit of the embodiment 1.

FIG. 5 is a diagram illustrating the configuration of the slave circuit of the embodiment 1. FIG. 6 is a diagram illustrating one example of an internal configuration of the first digital circuit of the embodiment 1. Note that the system configuration with a slave circuit 102a is similar to that of the comparison example illustrated in FIG. 1, and thus, the illustration and description thereof are omitted.

The slave circuit 102a further includes a third digital circuit 130 in addition to the configuration of the slave circuit 102 illustrated in FIG. 1. A digital circuit 100a in the present embodiment corresponds to a "digital output monitor circuit" of the present disclosure.

Figure 7:
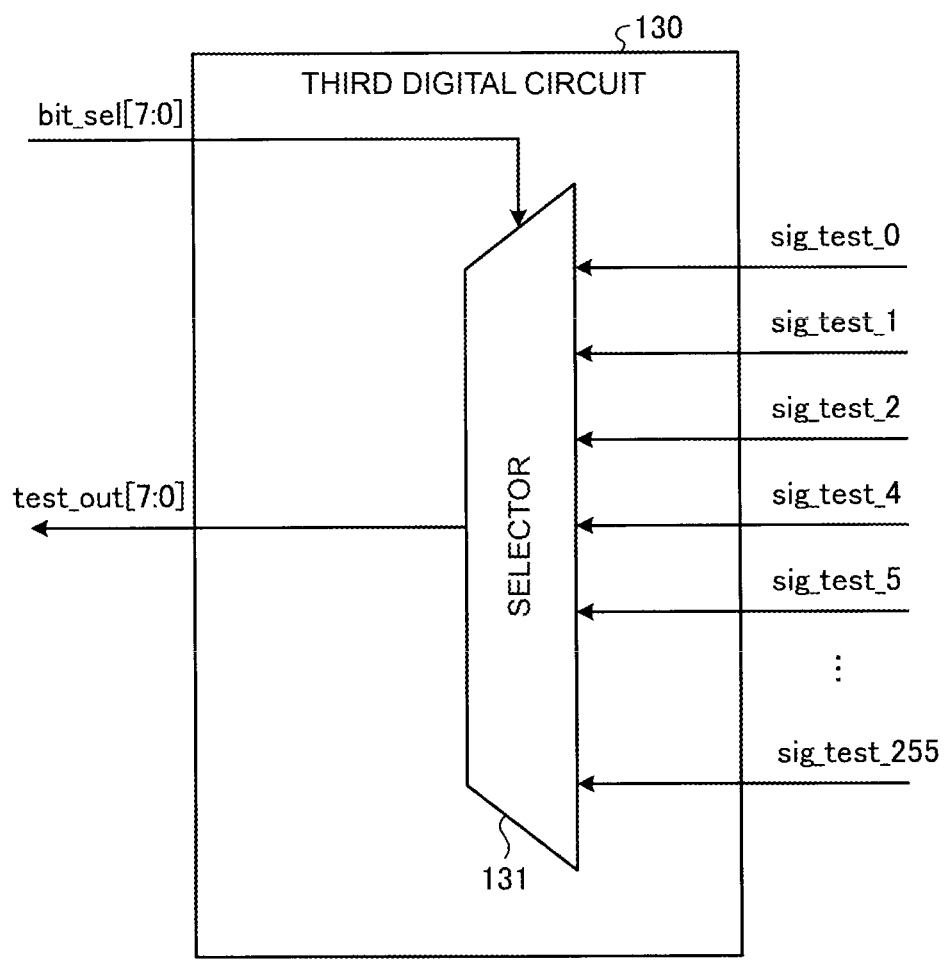
FIG. 7 is a diagram illustrating one example of an internal configuration of a third digital circuit of the embodiment 1.

FIG. 7 is a diagram illustrating one example of an internal configuration of the third digital circuit of the embodiment 1. The third digital circuit 130 includes a selector 131. The selector 131 is illustrated as having the configuration in which the control signal for an analog circuit output from the second digital circuit 120 is input bit by bit as a test signal sig_test_0, . . . , sig_test_255. However, the configuration illustrated in FIG. 7 is one example and is not limited thereto.

In the configuration illustrated in FIG. 7, the third digital circuit 130 selects each of the test signals sig_test_0, . . . , sig_test_255 based on a bit switch signal bit_sel[7:0] and outputs to a first digital circuit 110a as test data test_out[7:0]. This enables to convert the control signals for an analog circuit output from the second digital circuit 120 into digital data. Note that in the present embodiment, the digital data output from the third digital circuit 130 is 8-bit data but is not limited thereto.

The first digital circuit 110a includes registers 112-s and 112-t in addition to the configuration of the first digital circuit 110 illustrated in FIG. 2. The registers 112-1, . . . , 112-n, and 112-s in the present embodiment, each correspond to a "first register" of the present disclosure. The registers 112-t in the present embodiment corresponds to a "second register" of the present disclosure.

Based on the control command included in the input data signal data_in, a control circuit 111a converts control information for the analog circuit 200 into control data that is a plurality (n in the present disclosure) of pieces of parallel data (8-bit parallel data in the present disclosure) and outputs to the registers 112-1, . . . , 112-n as the write data write_data_in(1) [7:0], . . . , write_data_in(n) [7:0], respectively. The write data write_data_in(1) [7:0], . . . , write_data_in(n) [7:0] are respectively written in the registers 112-1, . . . , 112-n and output to the second digital circuit 120 in the subsequent stage as the register data reg_data_out(1) [7:0], . . . , reg_data_out(n) [7:0].

Further, the register data reg_data_out(1) [7:0], . . . , reg_data_out(n) [7:0] are read out by the readout circuit 113a as readout data reg_data_in(1) [7:0], . . . , reg_data_in (n) [7:0], respectively.

Further, the control circuit 111a outputs control data for the third digital circuit 130 to the register 112-s as write data write_data_in(s) [7:0] based on the control command included in the input data signal data_in. The write data write_data_in(s) [7:0] is written in the register 112-s and output to the third digital circuit 130 in the subsequent stage as register data reg_data_out(s) [7:0].

The register data reg_data_out(s) [7:0] corresponds to the bit switch signal bit_sel[7:0] illustrated in FIG. 7.

Further, the register data reg_data_out(s) [7:0] is read out by the readout circuit 113a as readout data reg_data_in(s) [7:0].

Further, the first digital circuit 110a receives the test data test_out[7:0] output from the third digital circuit 130 as write data write_data_in(t) [7:0]. The write data write_data_in(t) [7:0] is written in the register 112-t and read out by the readout circuit 113a as the readout data reg_data_in(t) [7:0].

The readout circuit 113a outputs the readout data reg_data_in(1) [7:0], . . . , reg_data_in(n) [7:0], reg_data_in(s) [7:0], and reg_data_in(t) [7:0], which are read out from the registers 112-1, . . . , 112-t, to the control circuit 111a as the output data out_data[7:0].

The control circuit 111a receives the output data out_data [7:0] output from the readout circuit 113a as the readout data read_data[7:0]. The control circuit 111a converts the readout data read_data[7:0] into the output data signal data_out, which is serial data, and outputs to the master circuit 101.

In the present embodiment, as described above, the third digital circuit 130 is provided for converting the control signal for an analog circuit output from the second digital circuit 120 into digital data. This digital data is then converted into the output data signal data_out and output to the master circuit 101. This enables the master circuit 101 in the subsequent stage to conduct a test as to whether or not the control signal for an analog circuit output from the second digital circuit 120 is in a desired state that has been anticipated in advance.

Further, applying the digital circuit 100a ("digital output monitor circuit" of the present disclosure) to a high frequency front-end circuit enables to conduct a test as to whether or not a control signal for amplifier circuit output from the second digital circuit 120 is in a desired state that has been anticipated in advance.

As described above, the digital output monitor circuit and the high frequency front-end circuit according to the embodiment 1 each includes the first digital circuit 110a that performs mutual conversion between serial data and parallel data, the second digital circuit 120 that decodes data output from the first digital circuit 110a and generates a control signal for the analog circuit 200, and the third digital circuit 130 that converts at least the control signal for the analog circuit 200 into digital data. The first digital circuit 110a converts the data output from the third digital circuit 130 into serial data and outputs as the output data signal data_out.

Specifically, the first digital circuit 110a includes the control circuit 111a, the registers 112-1, . . . , 112-n and 112-s (first register) in which data output from the control circuit 111a are written, the register 112-t (second register) in which data output from the third digital circuit 130 is written, and the readout circuit 113 that reads out the data written in the registers 112-1, . . . , 112-n and 112-s (first register) and the data written in the register 112-t (second register) and outputs to the control circuit 111a. The control circuit 111a writes the control data of the analog circuit 200 included in the input data signal data_in, which is serial data, in the registers 112-1, . . . , 112-n and 112-s (first register), converts data output from the readout circuit 113 into serial data, and outputs as the output data signal data_out.

The foregoing configuration enables the master circuit 101 in the subsequent stage to conduct a test as to whether or not the control signal for the analog circuit 200 output from the second digital circuit 120 is in a desired state that has been anticipated in advance.

Embodiment 2

Figure 8:
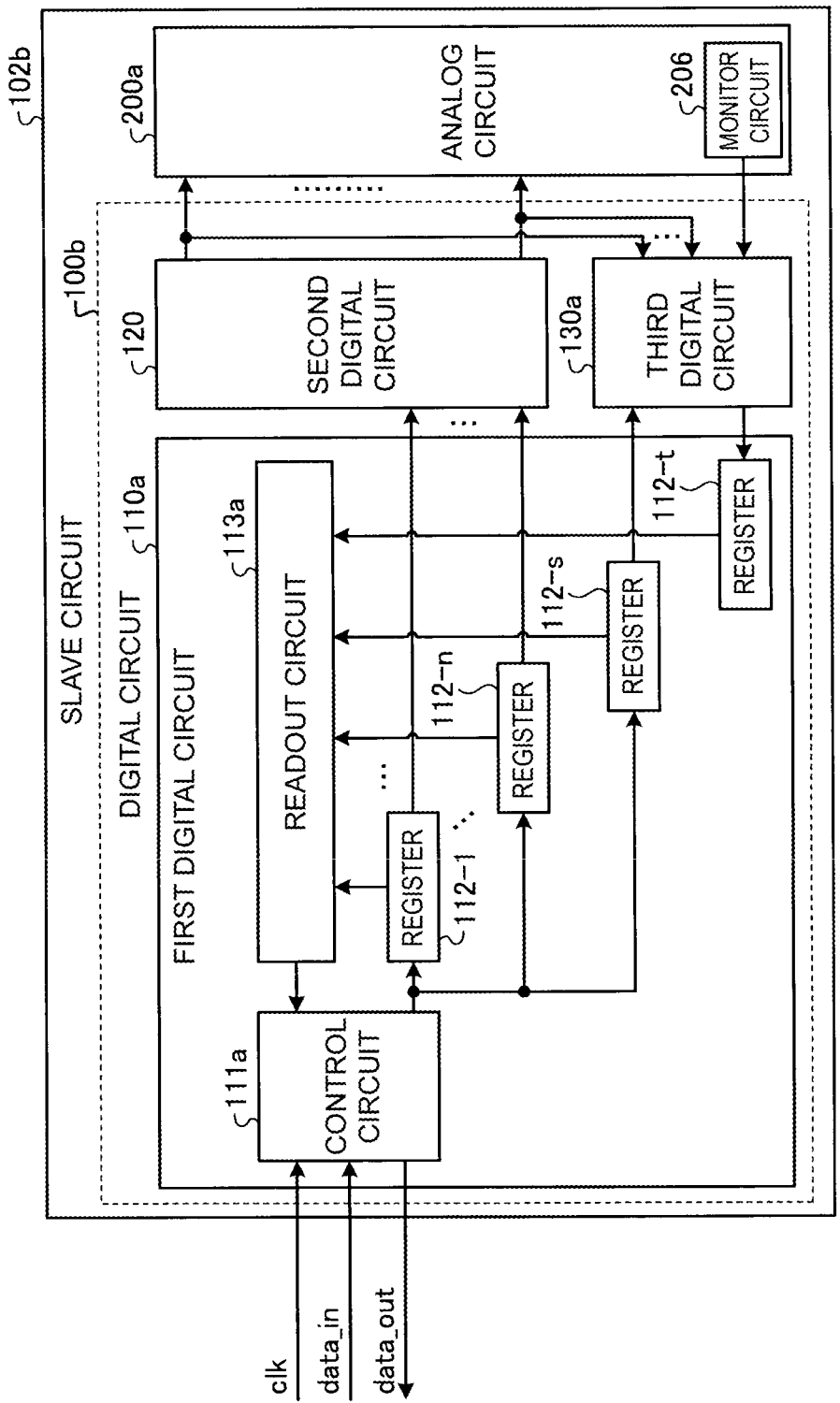
FIG. 8 is a diagram illustrating a configuration of a slave circuit of an embodiment 2.

FIG. 8 is a diagram illustrating the configuration of a slave circuit of the embodiment 2. Note that the system configuration with a slave circuit 102b is similar to that of the comparison example illustrated in FIG. 1, and thus, the illustration and description thereof are omitted. Further, the internal configuration of a first digital circuit 110a is similar to that of the embodiment 1 illustrated in FIG. 6, and thus, the illustration and description thereof are omitted. Further, the internal configuration of a third digital circuit 130a is similar to the internal configuration of the third digital circuit 130 of the embodiment 1 illustrated in FIG. 7, and thus, the illustration and description thereof are omitted.

An analog circuit 200a of the slave circuit 102b includes a monitor circuit 206 that monitors the state of a predetermined node inside the analog circuit 200a. A digital circuit 100b in the present embodiment corresponds to the "digital output monitor circuit" of the present disclosure.

Figure 9:
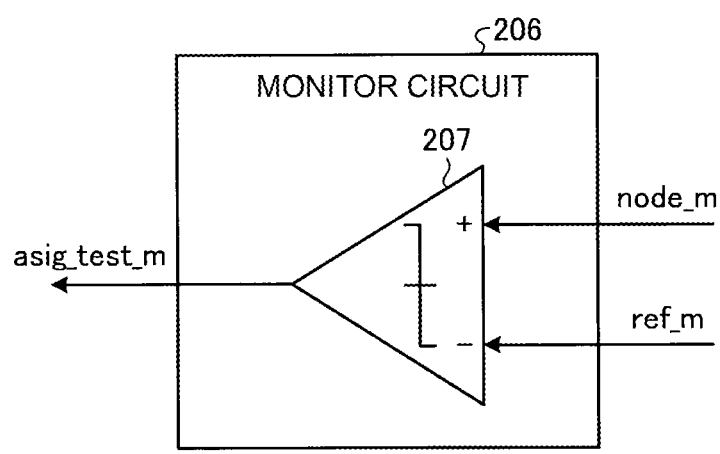
FIG. 9 is a diagram illustrating one example of a configuration of a monitor circuit to be provided in an analog circuit.

FIG. 9 is a diagram illustrating one example of a configuration of the monitor circuit to be provided in the analog circuit. The monitor circuit 206 includes a monitor ADC circuit 207. Note that FIG. 9 illustrates the example in which only one monitor ADC circuit 207 is provided. However, the configuration of the monitor circuit 206 illustrated in FIG. 9 is one example and is not limited thereto. For example, in the case where there is a plurality of nodes to be monitored inside the analog circuit 200a, a configuration in which a plurality of monitor ADC circuits 207 is provided may alternatively be employed.

The monitor ADC circuit 207 receives a node signal node_m from a predetermined node inside the analog circuit 200a. The monitor ADC circuit 207 compares a predetermined reference signal ref_m with the node signal node_m and outputs, to the third digital circuit 130a, an analog test signal asig_test_m that is set to "1" when the node signal node_m is equal to or higher than the reference signal ref_m or "0" when the node signal node_m is less than the reference signal ref_m.

In the configuration illustrated in FIG. 7, the analog test signal asig_test_m output from the monitor ADC circuit 207 is input to the third digital circuit 130a in place of one of the test signals sig_test_0, . . . , sig_test_255. The third digital circuit 130a selects each of the test signals, which are control signals for the analog circuit 200a, and the analog test signal asig_test_m, which indicates the state of a predetermined node inside the analog circuit 200a, based on the bit switch signal bit_sel[7:0] and outputs to the first digital circuit 110a as the test data test_out[7:0]. This enables to convert the control signal for the analog circuit 200a output from the second digital circuit 120 and the analog test signal asig_test_m output from the third digital circuit 130a into digital data.

In the following, by the operation of the first digital circuit 110a similar to that of the embodiment 1, the test data test_out[7:0] including the state of a predetermined node inside the analog circuit 200a is converted into the output data signal data_out and output to the master circuit 101. This enables the master circuit 101 in the subsequent stage to conduct a test as to whether or not the state of a predetermined node inside the analog circuit 200a is in a desired state that has been anticipated in advance.

Further, applying the digital circuit 100b ("digital output monitor circuit" of the present disclosure) to a high frequency front-end circuit enables to conduct a test as to whether or not the state of a predetermined node of the amplifier circuit is in a desired state that has been anticipated in advance.

As described above, in the digital output monitor circuit and the high frequency front-end circuit according to the embodiment 2, the third digital circuit 130a converts the control signal for the analog circuit 200a and the analog test signal indicating the state of a predetermined node inside the analog circuit 200a into digital data.

The foregoing configuration enables the master circuit 101 in the subsequent stage to conduct a test as to whether or not the state of a predetermined node inside the analog circuit 200a is in a desired state that has been anticipated in advance.

Embodiment 3

Figure 10:
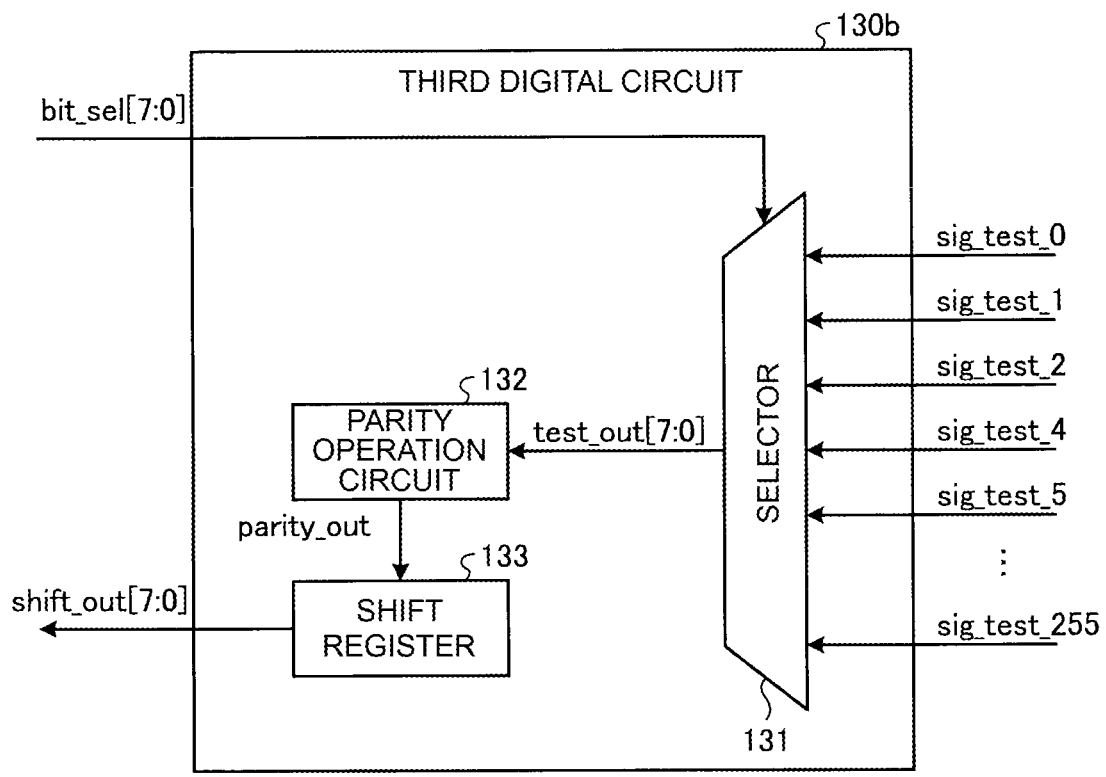
FIG. 10 is a diagram illustrating one example of an internal configuration of a third digital circuit of an embodiment 3.

FIG. 10 is a diagram illustrating a configuration of a third digital circuit of the embodiment 3. Note that the internal configuration of a first digital circuit is similar to that of the embodiment 1 illustrated in FIG. 6, and thus, the illustration and description thereof are omitted. Further, the configuration of a slave circuit with a third digital circuit 130b is similar to that of the embodiment 1 illustrated in FIG. 5 or that of the embodiment 2 illustrated in FIG. 8, and thus, the illustration and description thereof are omitted.

The third digital circuit 130b includes a parity operation circuit 132 and a shift register 133 in addition to the configuration of the third digital circuit 130 illustrated in FIG. 7.

The parity operation circuit 132 performs a parity operation process on the test data test_out[7:0] output from the selector 131 based on the bit switch signal bit_sel[7:0]. Specifically, the parity operation circuit 132 performs an exclusive-OR operation on each bit of the test data test_out[7:0]. The parity operation circuit 132 outputs a parity operation process result parity_out(1bit_data).

The shift register 133 accumulates 8 bits of the parity operation process result parity_out output from the parity operation circuit 132 while shifting bit by bit of the parity operation process result parity_out and outputs shift_out[7:0], which is 8-bit parallel data, to the first digital circuit 110a.

In the present embodiment, the first digital circuit 110a receives shift_out[7:0] output from the third digital circuit 130b as the write data write_data_in(t) [7:0]. The subsequent process of the first digital circuit 110a is similar to that of the embodiment 1.

Figure 11:
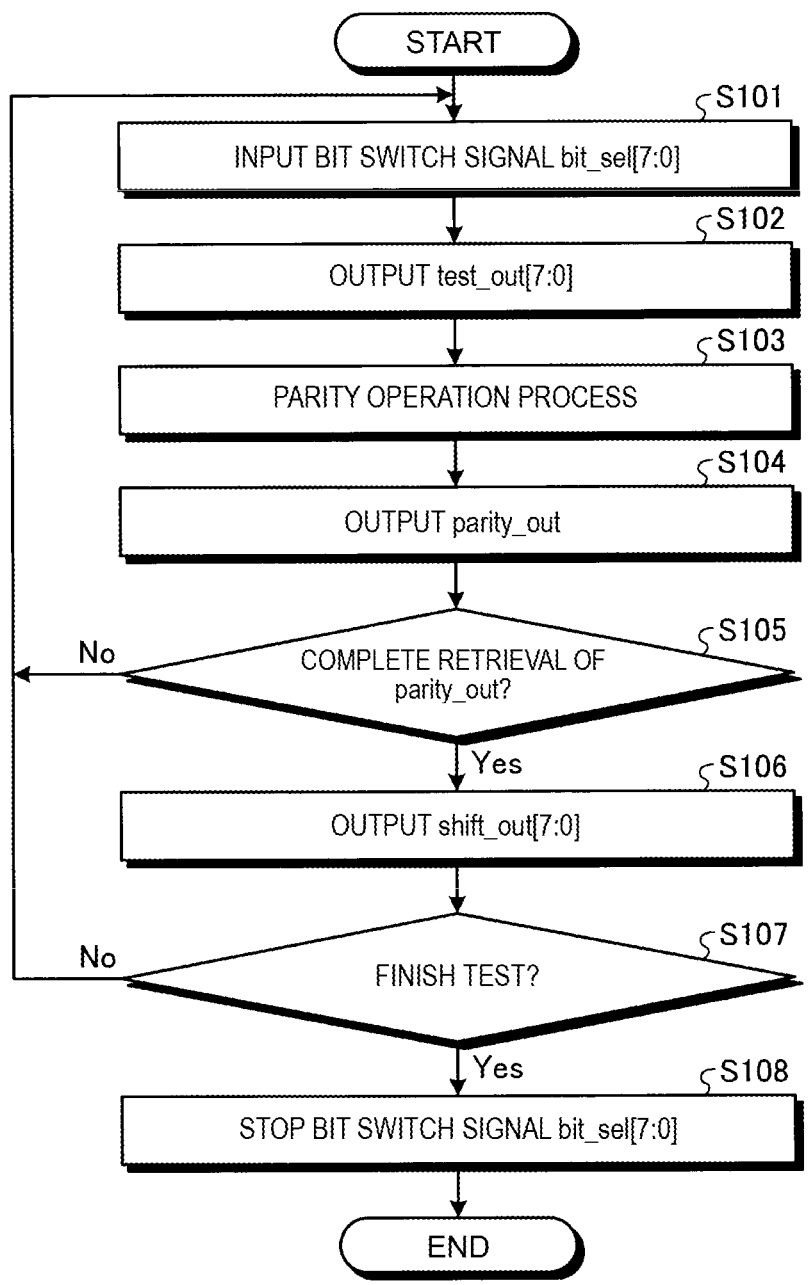
FIG. 11 is a flowchart illustrating one example of a test process of the embodiment 3.

Hereinafter, a specific example of a process in the present embodiment is described with reference to FIG. 11. FIG. 11 is a flowchart illustrating one example of a test process of the embodiment 3.

The first digital circuit 110a outputs the bit switch signal bit_sel[7:0] to the third digital circuit 130b based on a command received from the master circuit 101 in accordance with a predetermined test protocol. The received command is included in the input data signal data_in.

When the selector 131 receives the bit switch signal bit_sel[7:0] (step S101), the selector 131 outputs the test data test_out[7:0] (step S102). The parity operation circuit 132 performs the parity operation process on the test data test_out[7:0] output from the selector 131 based on the bit switch signal bit_sel[7:0] (step S103), and outputs the parity operation process result parity_out to the shift register 133 (step S104).

The shift register 133 illustrated in the present example is assumed to have the width of 8 bits. In this case, the shift register 133 can hold parities that are respectively calculated for up to eight combinations of bit_sel[7:0]. When retrieval of 8 bits of parity_out as shift_out[7:0] is completed (step S105; Yes), this shift_out[7:0] is output to the first digital circuit 110a (step S106). When shift_out[7:0] is not formed (step S105; No), the process from step S101 to step S105 is repeated until shift_out[7:0] is formed.

In response to a command received from the master circuit 101 when the process reaches the end of the predetermined test protocol (step S107; Yes), the first digital circuit 110a stops outputting the bit switch signal bit_sel[7:0] to the third digital circuit 130b (step S108). The received command is included in the input data signal data_in.

When the test is not finished (step S107; No), the process from step S101 to step S107 is repeated until the test is finished.

The first digital circuit 110a converts the shift_out[7:0] output from the third digital circuit 130b into the output data signal data_out, which is serial data, and outputs to the master circuit 101.

For example, in the configuration where the control signal for an analog circuit output from the second digital circuit 120 is input to the selector 131 bit by bit as the test signals sig_test_0, . . . , sig_test_255, when performing the test as to whether or not the control signal for an analog circuit output from the second digital circuit 120 is in a desired state that has been anticipated in advance, the correctness determination needs to be performed on each of the test signals sig_test_0, . . . , sig_test_255 in the embodiments 1 and 2 described above. In other words, for each of the test signals sig_test_0, . . . , sig_test_255, the master circuit 101 in the subsequent stage needs to hold an expectation value (value indicating a desired state that has been anticipated in advance) and perform a correctness determination process against the corresponding expectation value.

As described above, the present embodiment has the configuration that enables to perform the correctness determination on shift_out[7:0] that is the parity operation process result for each set of plural bits (8 bits in the example described above) of the test signals sig_test_0, . . . , sig_test_255. This enables the master circuit 101 in the subsequent stage to reduce processing at the time of conducting a test as to whether or not the control signal for an analog circuit output from the second digital circuit 120 is in a desired state that has been anticipated in advance.

As described above, in the digital output monitor circuit and the high frequency front-end circuit according to the embodiment 3, the third digital circuit 130b includes the parity operation circuit 132 that performs the parity operation process on digital data (test data test_out[7:0]).

The foregoing configuration enables the master circuit 101 in the subsequent stage to reduce processing at the time of conducting a test as to whether or not the state of a predetermined node inside the analog circuit 200 is in a desired state that has been anticipated in advance.

Modified Example of Embodiment 3

Figure 12:
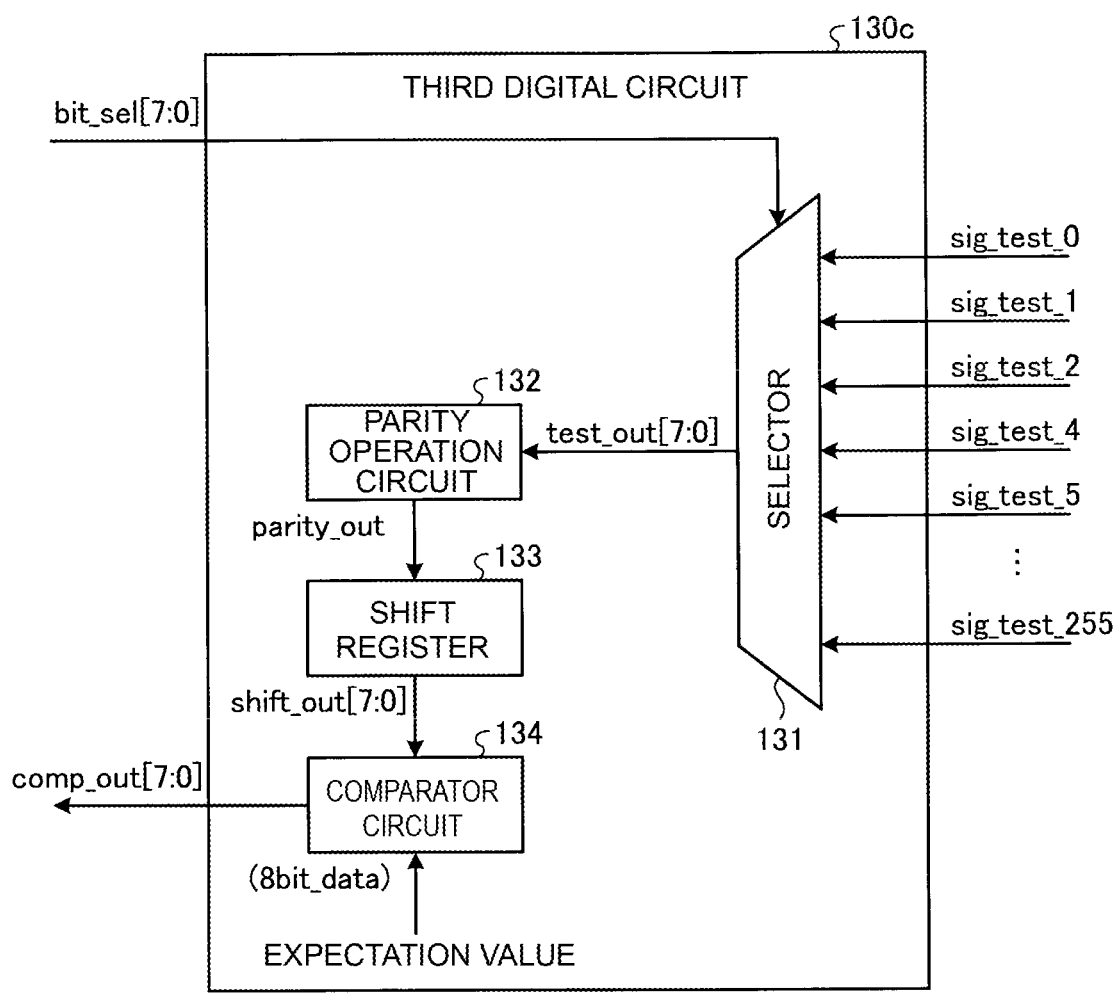
FIG. 12 is a diagram illustrating a configuration of a third digital circuit of a modified example of the embodiment 3.

FIG. 12 is a diagram illustrating a configuration of a third digital circuit of a modified example of the embodiment 3. Note that the internal configuration of a first digital circuit is similar to that of the embodiment 1 illustrated in FIG. 6, and thus, the illustration and description thereof are omitted. Further, the configuration of a slave circuit with a third digital circuit 130c is similar to that of the embodiment 1 illustrated in FIG. 5 or that of the embodiment 2 illustrated in FIG. 8, and thus, the illustration and description thereof are omitted.

The third digital circuit 130c includes a comparator circuit 134 in addition to the configuration of the third digital circuit 130b illustrated in FIG. 10.

The comparator circuit 134 compares shift_out[7:0] output from the shift register 133 with the expectation value (8bit_data) corresponding to this shift_out[7:0]. The comparator circuit 134 outputs a correctness determination result comp_out[7:0], which is obtained for shift_out[7:0] and the expectation values, to the first digital circuit 110a. Note that in some embodiments, for example, the expectation value corresponding to shift_out[7:0] may be input via the first digital circuit 110a or stored in advance in a memory (not illustrated) included in the third digital circuit 130c. Further, in some embodiments, for example, the expectation value corresponding to shift_out[7:0] may be retained by controlling electrical continuity and discontinuity of a fuse (not illustrated) provided on a die of a semiconductor device constituting the third digital circuit 130c.

In the modified example of the embodiment 3, the first digital circuit 110a receives comp_out[7:0] output from the third digital circuit 130c as the write data write_data_in(t) [7:0]. The subsequent process of the first digital circuit 110a is similar to that of the embodiment 1. Note that comp_out output from the third digital circuit 130c may be, for example, a one-bit data having a value of "0" indicating that the correctness determination result is correct or "1" indicating that the correctness determination result is incorrect.

Figure 13:
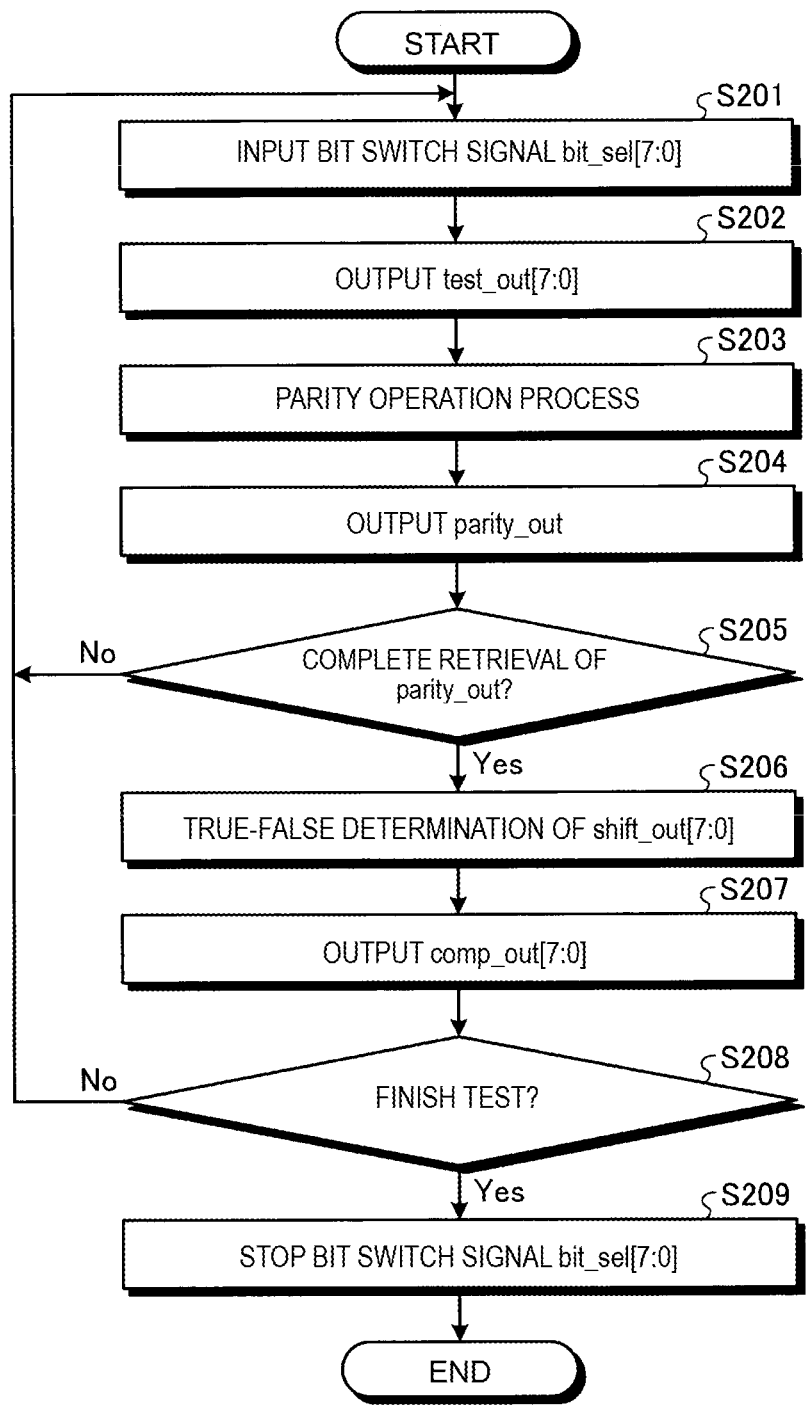
FIG. 13 is a flowchart illustrating one example of a test process of a modified example of the embodiment 3.

Hereinafter, a specific example of a process in the modified example of the embodiment 3 is described with reference to FIG. 13. FIG. 13 is a flowchart illustrating one example of a test process of the modified example of the embodiment 3.

The first digital circuit 110a outputs the bit switch signal bit_sel[7:0] to the third digital circuit 130c based on a command received from the master circuit 101 in accordance with a predetermined test protocol. The received command is included in the input data signal data_in.

When the selector 131 receives the bit switch signal bit_sel[7:0] (step S201), the selector 131 outputs the test data test_out[7:0] (step S202). The parity operation circuit 132 performs the parity operation process on the test data test_out[7:0] output from the selector 131 based on the bit switch signal bit_sel[7:0] (step S203), and outputs the parity operation process result parity_out to the shift register 133 (step S204).

The shift register 133 illustrated in the present example is assumed to have the width of 8 bits. In this case, the shift register 133 can hold parities respectively calculated for up to eight combinations of bit_sel[7:0]. When retrieval of 8 bits of parity_out as shift_out[7:0] is completed (step S205; Yes), this shift_out[7:0] is output to the comparator circuit 134. When shift_out[7:0] is not formed (step S205; No), the process from step S201 to step S205 is repeated until shift_out[7:0] is formed.

The comparator circuit 134 performs the correctness determination on shift_out[7:0] by comparing shift_out[7:0] output from the shift register 133 with the expectation value (8bit_data) corresponding to this shift_out[7:0] (step S206), and outputs the correctness determination result comp_out [7:0] to the first digital circuit 110a (step S207).

In response to a command received from the master circuit 101 when the process reaches the end of the predetermined test protocol (step S208; Yes), the first digital circuit 110a stops outputting the bit switch signal bit_sel[7: 0] to the third digital circuit 130c (step S209). The received command is included in the input data signal data_in.

When the test is not finished (step S208; No), the process from step S201 to step S208 is repeated until the test is finished.

The first digital circuit 110a converts the comp_out[7:0] output from the third digital circuit 130c into the output data signal data_out, which is serial data, and outputs to the master circuit 101.

As described above, the modified example of the embodiment 3 has the configuration provided with the comparator circuit 134 that performs the correctness determination on parity_out, which is the parity operation process result for each set of plural bits (8 bits in the example described above) of the test signals sig_test_0, . . . , sig_test_255. This enables the master circuit 101 in the subsequent stage to further reduce processing at the time of conducting a test as to whether or not the control signal for an analog circuit output from the second digital circuit 120 is in a desired state that has been anticipated in advance.

As described above, in the digital output monitor circuit and the high frequency front-end circuit according to the modified example of the embodiment 3, the third digital circuit 130c includes the comparator circuit 134 that compares parity_out (shift_out[7:0]), which is the operation process result of the parity operation circuit 132, with the expectation value (8bit_data) of this operation process result.

The foregoing configuration enables the master circuit 101 in the subsequent stage to further reduce processing at the time of conducting a test as to whether or not the state of a predetermined node inside the analog circuit 200 is in a desired state that has been anticipated in advance.

Embodiment 4

Figure 14:
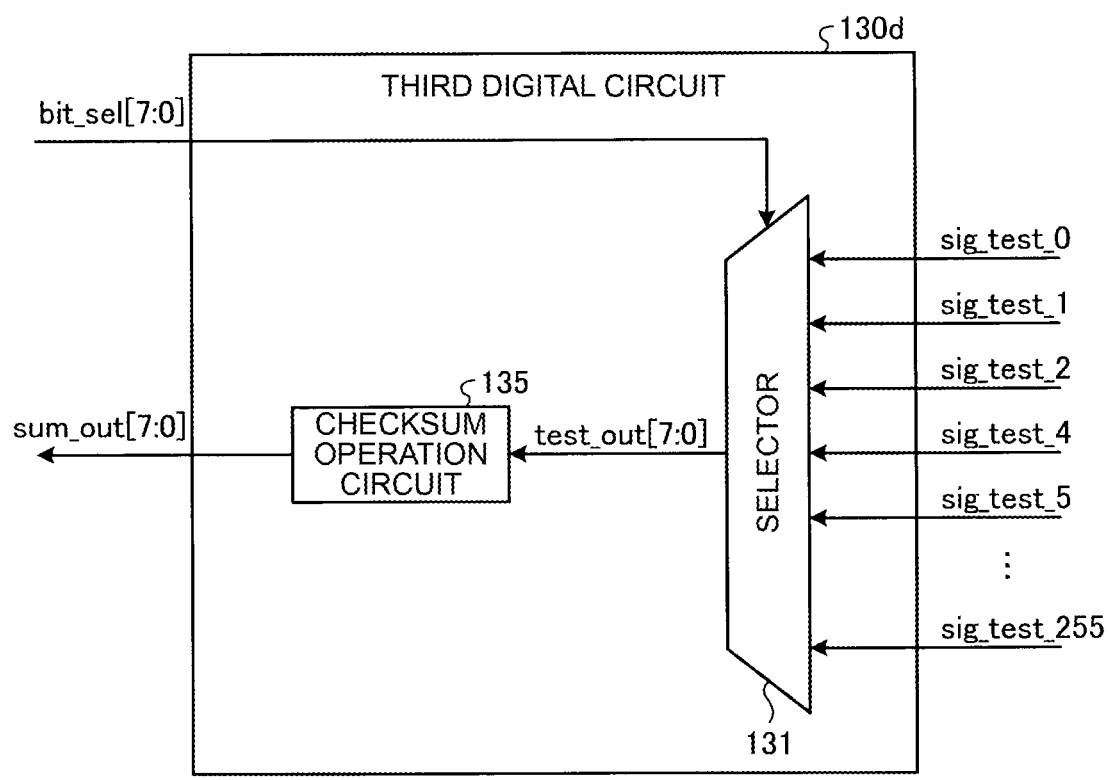
FIG. 14 is a diagram illustrating one example of an internal configuration of a third digital circuit of an embodiment 4.

FIG. 14 is a diagram illustrating one example of an internal configuration of a third digital circuit of the embodiment 4. Note that the internal configuration of the first digital circuit is similar to that of the embodiment 1 illustrated in FIG. 6, and thus, the illustration and description thereof are omitted. Further, the configuration of a slave circuit with a third digital circuit 130d is similar to that of the embodiment 1 illustrated in FIG. 5 or that of the embodiment 2 illustrated in FIG. 8, and thus, the illustration and description thereof are omitted.

The third digital circuit 130d includes a checksum operation circuit 135 in addition to the configuration of the third digital circuit 130 illustrated in FIG. 7.

The checksum operation circuit 135 performs a checksum operation process on the test data test_out[7:0] output from the selector 131 based on the bit switch signal bit_sel[7:0]. Specifically, the checksum operation circuit 135 performs a cumulative addition operation on each bit of the test data test_out[7:0]. The checksum operation circuit 135 outputs a checksum operation process result sum_out[7:0] (8bit_data).

In the present embodiment, the first digital circuit 110a receives sum_out[7:0] output from the third digital circuit 130d as the write data write_data_in(t) [7:0]. The subsequent process of the first digital circuit 110a is similar to that of the embodiment 1.

Figure 15:
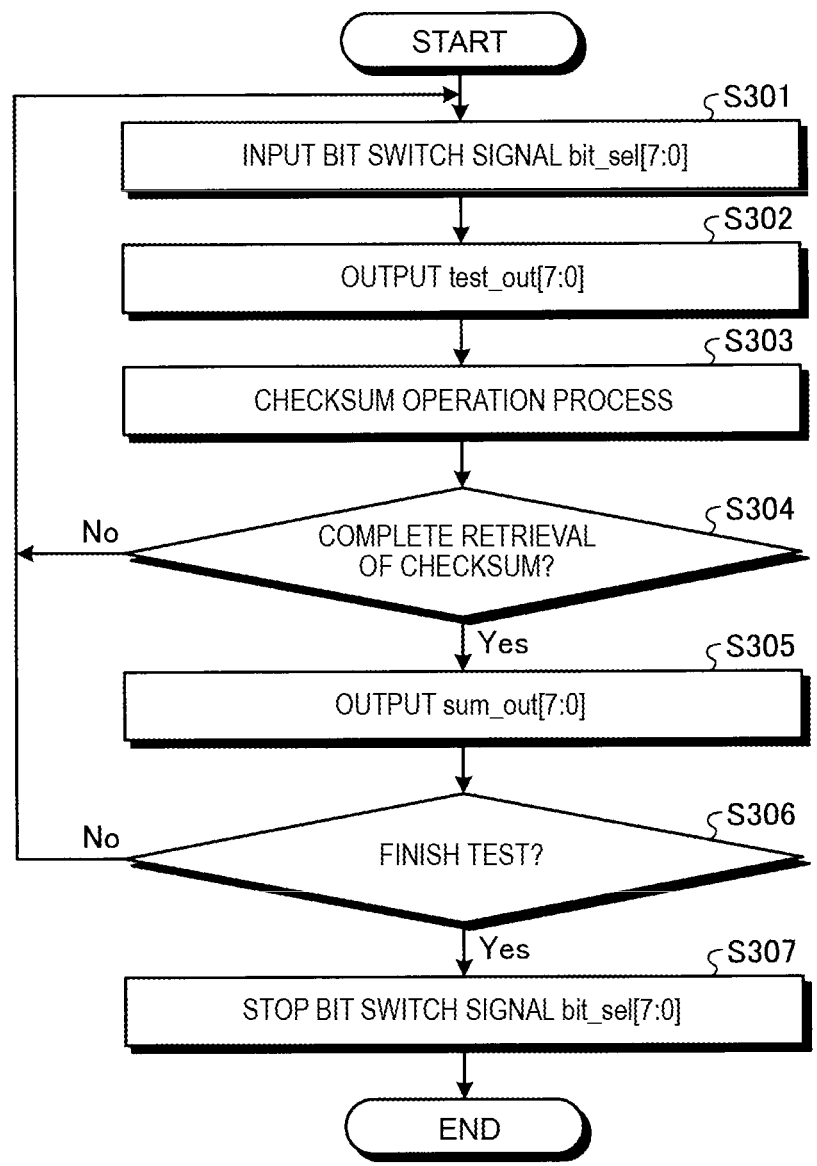
FIG. 15 is a flowchart illustrating one example of a test process of the embodiment 4.

Hereinafter, a specific example of a process in the present embodiment is described with reference to FIG. 15. FIG. 15 is a flowchart illustrating one example of a test process of the embodiment 4.

The first digital circuit 110a outputs the bit switch signal bit_sel[7:0] to the third digital circuit 130d based on a command received from the master circuit 101 in accordance with a predetermined test protocol. The received command is included in the input data signal data_in.

When the selector 131 receives the bit switch signal bit_sel[7:0] (step S301), the selector 131 outputs the test data test_out[7:0] (step S302). The checksum operation circuit 135 performs the checksum operation process on the test data test_out[7:0] output from the selector 131 based on the bit switch signal bit_sel[7:0] (step S303).

When retrieval of a checksum operation result is completed (step S304; Yes), the checksum operation circuit 135 outputs sum_out[7:0] to the first digital circuit 110a (step S305). When sum_out[7:0] is not formed (step S304; No), the process from step S301 to step S304 is repeated until sum_out[7:0] is formed.

In response to a command received from the master circuit 101 when the process reaches the end of the predetermined test protocol (step S306; Yes), the first digital circuit 110a stops outputting the bit switch signal bit_sel[7:0] to the third digital circuit 130d (step S307). The received command is included in the input data signal data_in.

When the test is not finished (step S306; No), the process from step S301 to step S306 is repeated until the test is finished.

The first digital circuit 110a converts the sum_out[7:0] output from the third digital circuit 130d into the output data signal data_out, which is serial data, and outputs to the master circuit 101.

For example, in the configuration in which the control signal for an analog circuit output from the second digital circuit 120 is input to the selector 131 bit by bit as the test signals sig_test_0, . . . , sig_test_255, when performing the test as to whether or not the control signal for an analog circuit output from the second digital circuit 120 is in a desired state that has been anticipated in advance, the correctness determination needs to be performed on each of the test signals sig_test_0, . . . , sig_test_255 in the embodiments 1 and 2 described above. In other words, for each of the test signals sig_test_0, . . . , sig_test_255, the master circuit 101 in the subsequent stage needs to hold an expectation value (value indicating a desired state that has been anticipated in advance) and perform a correctness determination process against the corresponding expectation value.

As described above, the present embodiment has the configuration that enables to perform the correctness determination on sum_out[7:0], which is the checksum operation process result of the cumulative addition operation for each bit of the test data test_out[7:0], using a plurality of bits (8 bits in the example described above) of the test signals sig_test_0, . . . , sig_test_255 as a single piece of the test data test_out[7:0]. This enables the master circuit 101 in the subsequent stage to reduce processing at the time of conducting a test as to whether or not the control signal for an analog circuit output from the second digital circuit 120 is in a desired state that has been anticipated in advance, compared with that of the embodiment 3.

As described above, in the digital output monitor circuit and the high frequency front-end circuit according to the embodiment 4, the third digital circuit 130d includes the checksum operation circuit 135 that performs the checksum operation process on digital data (test data test_out[7:0]).

The foregoing configuration enables the master circuit 101 in the subsequent stage to reduce processing at the time of conducting a test as to whether or not the state of a predetermined node inside the analog circuit 200 is in a desired state that has been anticipated in advance, compared with the embodiment 3.

Modified Example of Embodiment 4

Figure 16:
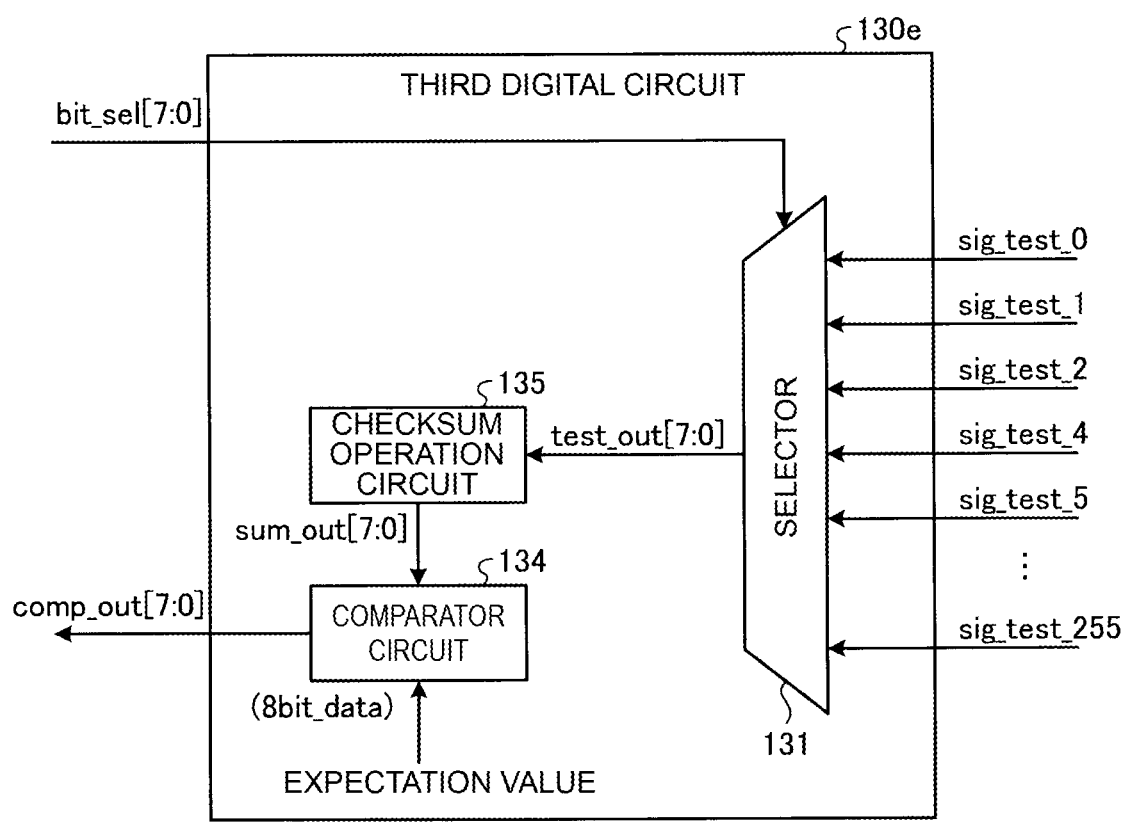
FIG. 16 is a diagram illustrating a configuration of a third digital circuit of a modified example of the embodiment 4.

FIG. 16 is a diagram illustrating a configuration of a third digital circuit of a modified example of the embodiment 4. Note that the internal configuration of the first digital circuit is similar to that of the embodiment 1 illustrated in FIG. 6, and thus, the illustration and description thereof are omitted. Further, the configuration of a slave circuit with a third digital circuit 130e is similar to that of the embodiment 1 illustrated in FIG. 5 or that of the embodiment 2 illustrated in FIG. 8, and thus, the illustration and description thereof are omitted.

The third digital circuit 130e includes a comparator circuit 134 in addition to the configuration of the third digital circuit 130d illustrated in FIG. 14.

The comparator circuit 134 compares sum_out[7:0] output from the checksum operation circuit 135 with the expectation value (8bit_data) corresponding to this sum_out [7:0]. The comparator circuit 134 outputs a correctness determination result comp_out[7:0], which is obtained for sum_out[7:0] and the expectation values, to the first digital circuit 110a. Note that in some embodiments, for example, the expectation value corresponding to sum_out[7:0] may be input via the first digital circuit 110a or stored in advance in a memory (not illustrated) included in the third digital circuit 130e. Further, in some embodiments, for example, the expectation value corresponding to shift_out[7:0] may be retained by controlling electrical continuity and discontinuity of a fuse (not illustrated) provided on a die of a semiconductor device constituting the third digital circuit 130e.

In the modified example of the embodiment 4, the first digital circuit 110a receives comp_out[7:0] output from the third digital circuit 130e as the write data write_data_in(t) [7:0]. The subsequent process is similar to that of the embodiment 1. Note that comp_out output from the third digital circuit 130e may be, for example, a one-bit data whose value is "0" indicating that the correctness determination result is correct or "1" indicating the correctness determination result is incorrect.

Figure 17:
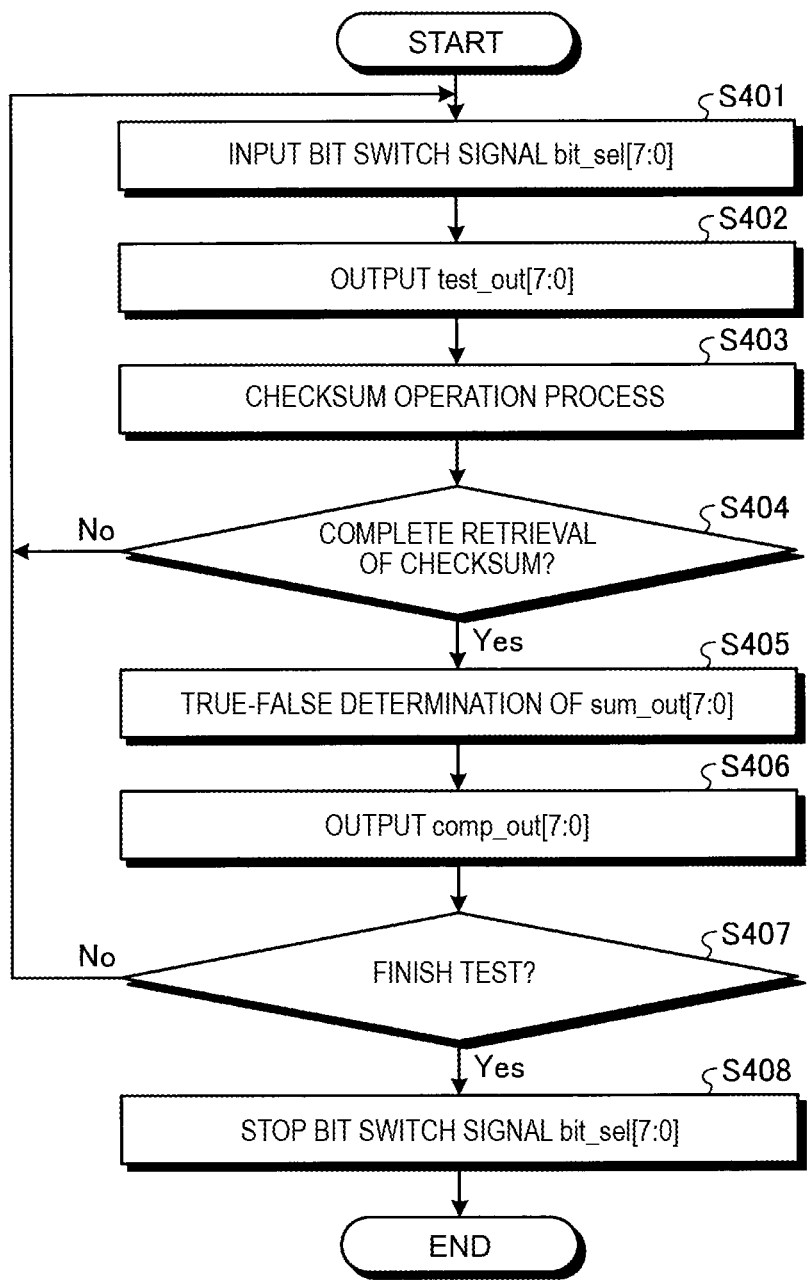
FIG. 17 is a flowchart illustrating one example of a test process of a modified example of the embodiment 4.

Hereinafter, a specific example of a process in the modified example of the embodiment 4 is described with reference to FIG. 17. FIG. 17 is a flowchart illustrating one example of a test process of a modified example of the embodiment 4.

The first digital circuit 110a outputs the bit switch signal bit_sel[7:0] to the third digital circuit 130 based on a command received from the master circuit 101 in accordance with a predetermined test protocol. The received command is included in the input data signal data_in.

When the selector 131 receives the bit switch signal bit_sel[7:0] (step S401), the selector 131 outputs the test data test_out[7:0] (step S402). The checksum operation circuit 135 performs the checksum operation process on the test data test_out[7:0] output from the selector 131 based on the bit switch signal bit_sel[7:0] (step S403).

When retrieval of a checksum operation result is completed (step S404; Yes), the checksum operation circuit 135 outputs sum_out[7:0] to the comparator circuit 134. When sum_out[7:0] is not formed (step S404; No), the process from step S401 to step S404 is repeated until sum_out[7:0] is formed.

The comparator circuit 134 performs the correctness determination on sum_out[7:0] by comparing sum_out[7:0] output from the shift register 133 with the expectation value (8bit_data) corresponding to this sum_out[7:0] (step S405), and outputs the correctness determination result comp_out [7:0] to the first digital circuit 110a (step S406).

In response to a command received from the master circuit 101 when the process reaches the end of the predetermined test protocol (step S407; Yes), the first digital circuit 110a stops outputting the bit switch signal bit_sel[7:0] to the third digital circuit 130e (step S408). The received command is included in the input data signal data_in.

When the test is not finished (step S407; No), the process from step S401 to step S407 is repeated until the test is finished.

The first digital circuit 110a converts the comp_out[7:0] output from the third digital circuit 130e into the output data signal data_out, which is serial data, and outputs to the master circuit 101.

As described above, the modified example of the embodiment 4 has the configuration including the comparator circuit 134 that performs the correctness determination on sum_out[7:0], which is the checksum operation process result of the cumulative addition operation performed on each bit of the test data test_out[7:0], using a plurality of bits (8 bits in the example described above) of the test signals sig_test_0, . . . , sig_test_255 as a single piece of the test data test_out[7:0]. This enables the master circuit 101 in the subsequent stage to further reduce processing at the time of conducting a test as to whether or not the control signal for an analog circuit output from the second digital circuit 120 is in a desired state that has been anticipated in advance.

As described above, in the digital output monitor circuit and the high frequency front-end circuit according to the modified example of the embodiment 4, the third digital circuit 130e includes the comparator circuit 134 that compares sum_out[7:0], which is the operation process result of the checksum operation circuit 135, with the expectation value (8bit_data) of this operation process result.

The foregoing configuration enables the master circuit 101 in the subsequent stage to further reduce processing at the time of conducting a test as to whether or not the state of a predetermined node inside the analog circuit 200 is in a desired state that has been anticipated in advance.

Each of the embodiment described above is provided to facilitate understanding of the present disclosure and is not to be construed as limiting the present disclosure. The present disclosure can be modified or improved without necessarily departing from the spirit thereof, and the present disclosure also includes equivalents thereof.

Further, the present disclosure can have the following configurations as described above or in place of the above.

(1) A digital output monitor circuit according to one aspect of the present disclosure includes: a first digital circuit that performs mutual conversion between serial data and parallel data; a second digital circuit that decodes data output from the first digital circuit and generates a control signal for an analog circuit; and a third digital circuit that converts at least the control signal for an analog circuit into digital data, wherein the first digital circuit converts data output from the third digital circuit into serial data and outputs as a output data signal.

This configuration enables a master circuit in the subsequent stage to conduct a test as to whether or not the control signal for the analog circuit output from the second digital circuit is in a desired state that has been anticipated in advance.

(2) In the digital output monitor circuit of the foregoing (1), the first digital circuit includes a control circuit, a first register in which data output from the control circuit is written, a second register in which data output from the third digital circuit is written, and a readout circuit that reads out the data written in the first register and the data written in the second register and outputs to the control circuit.

(3) In the digital output monitor circuit of the foregoing (2), the control circuit writes control data for an analog circuit in the first register, the control data for an analog circuit being included in an input data signal, the input data signal being serial data, and converts data output from the readout circuit into serial data and outputs as the output data signal.

(4) In the digital output monitor circuit of any of the foregoing (1) to (3), the third digital circuit converts the control signal for an analog circuit and an analog test signal indicating a state of a predetermined node of the analog circuit into digital data.

This configuration enables the master circuit in the subsequent stage to conduct a test as to whether or not the state of a predetermined node inside the analog circuit is in a desired state that has been anticipated in advance.

(5) In the digital output monitor circuit of any of the foregoing (1) to (4), the third digital circuit includes a parity operation circuit that performs a parity operation on the digital data.

This configuration enables the master circuit in the subsequent stage to reduce processing at the time of conducting a test as to whether or not the state of a predetermined node inside the analog circuit is in a desired state that has been anticipated in advance.

(6) In the digital output monitor circuit of the foregoing (5), the third digital circuit includes a comparator circuit that compares an operation process result of the parity operation circuit with an expectation value of the operation process result.

This configuration enables the master circuit in the subsequent stage to reduce processing at the time of conducting a test as to whether or not the state of a predetermined node inside the analog circuit is in a desired state that has been anticipated in advance, compared with the foregoing (5).

(7) In the digital output monitor circuit of any of the foregoing (1) to (4), the third digital circuit includes a checksum operation circuit that performs a checksum operation on the digital data.

This configuration enables the master circuit in the subsequent stage to reduce processing at the time of conducting a test as to whether or not the state of a predetermined node inside the analog circuit is in a desired state that has been anticipated in advance, compared with the foregoing (5).

(8) In the digital output monitor circuit of the foregoing (7), the third digital circuit includes a comparator circuit that compares an operation process result of the checksum operation circuit with an expectation value of the operation process result.

This configuration enables the master circuit in the subsequent stage to reduce processing at the time of conducting a test as to whether or not the state of a predetermined node inside the analog circuit is in a desired state that has been anticipated in advance, compared with the foregoing (7).

(9) A high frequency front-end circuit according to one aspect of the present disclosure includes the digital output monitor circuit of any of the foregoing (1) to (8) and an amplifier circuit that amplifies a high frequency signal, the amplifier circuit serving as the analog circuit.

This configuration enables to conduct a test as to whether or not a control signal for the amplifier circuit output from the second digital circuit is in a desired state that has been anticipated in advance. Further, this enables to conduct a test as to whether or not the state of a predetermined node inside the amplifier circuit is in a desired state that has been anticipated in advance.

The present disclosure enables to facilitate testing of an analog circuit in the configuration where a digital circuit and the analog circuit are mounted together.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A digital output monitor circuit comprising:
 a first digital circuit configured to perform mutual conversion between serial data and parallel data;
 a second digital circuit configured to decode data output from the first digital circuit and to generate a control signal for an analog circuit; and
 a third digital circuit configured to output digital data,
 wherein at least the control signal is input to the third digital circuit, and
 wherein the first digital circuit is further configured to convert the digital data output from the third digital circuit into the serial data, and to output the serial data as an output data signal.

2. The digital output monitor circuit according to claim 1, wherein the first digital circuit comprises:
 a control circuit;
 a first register in which data output from the control circuit is written;
 a second register in which data output from the third digital circuit is written; and
 a readout circuit configured to read out the data written in the first register and the data written in the second register, and to output data to the control circuit.

3. The digital output monitor circuit according to claim 2, wherein the control circuit is configured to:
 write control data for the analog circuit in the first register, the control data being included in an input data signal, and the input data signal being a serial data signal, and
 convert data output from the readout circuit into serial data, and to output the serial data as the output data signal.

4. The digital output monitor circuit according to claim 1, wherein the control signal and an analog test signal are input to the third digital circuit, the analog test signal indicating a state of a predetermined node of the analog circuit.

5. The digital output monitor circuit according to claim 2, wherein the control signal and an analog test signal are input to the third digital circuit, the analog test signal indicating a state of a predetermined node of the analog circuit.

6. The digital output monitor circuit according to claim 3, wherein the control signal and an analog test signal are input to the third digital circuit, the analog test signal indicating a state of a predetermined node of the analog circuit.

7. The digital output monitor circuit according to claim 1, wherein the third digital circuit comprises a parity operation circuit configured to perform a parity operation on the digital data.

8. The digital output monitor circuit according to claim 7, wherein the third digital circuit further comprises a comparator circuit configured to compare an operation process result of the parity operation circuit with an expectation value of the operation process result.

9. The digital output monitor circuit according to claim 2, wherein the third digital circuit comprises a parity operation circuit configured to perform a parity operation on the digital data.

10. The digital output monitor circuit according to claim 3, wherein the third digital circuit comprises a parity operation circuit configured to perform a parity operation on the digital data.

11. The digital output monitor circuit according to claim 4, wherein the third digital circuit comprises a parity operation circuit configured to perform a parity operation on the digital data.

12. The digital output monitor circuit according to claim 1, wherein the third digital circuit comprises a checksum operation circuit configured to perform a checksum operation on the digital data.

13. The digital output monitor circuit according to claim 12, wherein the third digital circuit further comprises a comparator circuit configured to compare an operation process result of the checksum operation circuit with an expectation value of the operation process result.

14. The digital output monitor circuit according to claim 2, wherein the third digital circuit comprises a checksum operation circuit configured to perform a checksum operation on the digital data.

15. The digital output monitor circuit according to claim 3, wherein the third digital circuit comprises a checksum operation circuit configured to perform a checksum operation on the digital data.

16. The digital output monitor circuit according to claim 4, wherein the third digital circuit comprises a checksum operation circuit configured to perform a checksum operation on the digital data.

17. A high frequency front-end circuit comprising:
 the digital output monitor circuit according to claim 1; and
 an amplifier circuit configured to amplify a high frequency signal,
wherein the amplifier circuit is the analog circuit.

18. A high frequency front-end circuit comprising:
 the digital output monitor circuit according to claim 2; and
 an amplifier circuit configured to amplify a high frequency signal,
wherein the amplifier circuit is the analog circuit.

19. A high frequency front-end circuit comprising:
 the digital output monitor circuit according to claim 3; and
 an amplifier circuit configured to amplify a high frequency signal,
wherein the amplifier circuit is the analog circuit.

20. A high frequency front-end circuit comprising:
 the digital output monitor circuit according to claim 4; and
 an amplifier circuit configured to amplify a high frequency signal,
wherein the amplifier circuit is the analog circuit.

* * * * *